US010269729B2

(12) United States Patent
Kuo et al.

(10) Patent No.: US 10,269,729 B2
(45) Date of Patent: Apr. 23, 2019

(54) SEMICONDUCTOR PACKAGES HAVING WIRE BOND WALL TO REDUCE COUPLING

(71) Applicant: NXP USA, Inc., Austin, TX (US)

(72) Inventors: Shun Meen Kuo, Chandler, AZ (US); Paul R. Hart, Phoenix, AZ (US); Margaret A. Szymanowski, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/985,640

(22) Filed: May 21, 2018

(65) Prior Publication Data

US 2018/0269158 A1 Sep. 20, 2018

Related U.S. Application Data

(60) Continuation of application No. 14/995,831, filed on Jan. 14, 2016, now Pat. No. 9,978,691, which is a
(Continued)

(51) Int. Cl.
*H01L 23/12* (2006.01)
*H01L 23/552* (2006.01)
(Continued)

(52) U.S. Cl.
CPC ............ *H01L 23/552* (2013.01); *H01L 23/66* (2013.01); *H01L 24/04* (2013.01); *H01L 24/49* (2013.01);
(Continued)

(58) Field of Classification Search
None
See application file for complete search history.

(56) References Cited

U.S. PATENT DOCUMENTS 6,734,728 B1 * 5/2004 Leighton ............... H01L 23/66
257/401
8,367,469 B2 * 2/2013 Bonthron ............... H01L 23/04
257/704
(Continued)

FOREIGN PATENT DOCUMENTS

CN        104253095 A    12/2014
JP        2007173955 A    7/2007
(Continued)

OTHER PUBLICATIONS

Final Office Action dated Nov. 15, 2018 for U.S. Appl. No. 15/097,014 9 pgs.
(Continued)

*Primary Examiner* — Hung Vu

(57) ABSTRACT

A device (e.g., a Doherty amplifier) housed in an air cavity package includes one or more isolation structures over a surface of a substrate and defining an active circuit area. The device also includes first and second adjacent circuits within the active circuit area, first and second leads coupled to the isolation structure(s) between opposite sides of the package and electrically coupled to the first circuit, third and fourth leads coupled to the isolation structure(s) between the opposite sides of the package and electrically coupled to the second circuit, a first terminal over the first side of the package between the first lead and the third lead, a second terminal over the second side of the package between the second lead and the fourth lead, and an electronic component coupled to the package and electrically coupled to the first terminal, the second terminal, or both the first and second terminals.

21 Claims, 8 Drawing Sheets

Related U.S. Application Data division of application No. 14/261,387, filed on Apr. 24, 2014, now Pat. No. 9,240,390, which is a continuation-in-part of application No. 13/929,688, filed on Jun. 27, 2013, now Pat. No. 9,401,342.

(51) Int. Cl.

| | | |
|---|---|---|
| *H01L 23/00* | (2006.01) | |
| *H03F 1/02* | (2006.01) | |
| *H01L 23/66* | (2006.01) | |
| *H03F 3/195* | (2006.01) | |
| *H03F 3/21* | (2006.01) | |

(52) U.S. Cl.
CPC ........... *H01L 24/85* (2013.01); *H03F 1/0288* (2013.01); *H03F 3/195* (2013.01); *H03F 3/211* (2013.01); *H01L 24/45* (2013.01); *H01L 24/48* (2013.01); *H01L 2223/6611* (2013.01); *H01L 2223/6644* (2013.01); *H01L 2223/6655* (2013.01); *H01L 2223/6661* (2013.01); *H01L 2224/04042* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48195* (2013.01); *H01L 2224/48472* (2013.01); *H01L 2224/49111* (2013.01); *H01L 2224/49175* (2013.01); *H01L 2224/85* (2013.01); *H01L 2924/19107* (2013.01); *H01L 2924/30111* (2013.01); *H03F 2200/222* (2013.01); *H03F 2200/387* (2013.01)

(56) References Cited

U.S. PATENT DOCUMENTS

| | | |
|---|---|---|
| 9,113,549 B2 | 8/2015 | Steinbeiser et al. |
| 9,401,342 B2 | 7/2016 | Meen Kuo et al. |
| 9,450,547 B2 | 9/2016 | Szymanowski et al. |
| 9,941,845 B2 | 4/2018 | Noori et al. |
| 2011/0204980 A1 | 8/2011 | Blednov |
| 2014/0055217 A1* | 2/2014 | Sutardja ............. H01L 23/5227 333/24 R |

FOREIGN PATENT DOCUMENTS

| | | |
|---|---|---|
| JP | 2012222491 A | 11/2012 |
| JP | 2013074249 A | 4/2013 |
| JP | 2014512152 A | 5/2014 |
| JP | 2015115960 A | 6/2015 |

OTHER PUBLICATIONS

Non Final Office Action; U.S. Appl. No. 15/097,014; 19 pages (dated Jan. 25, 2019).

* cited by examiner

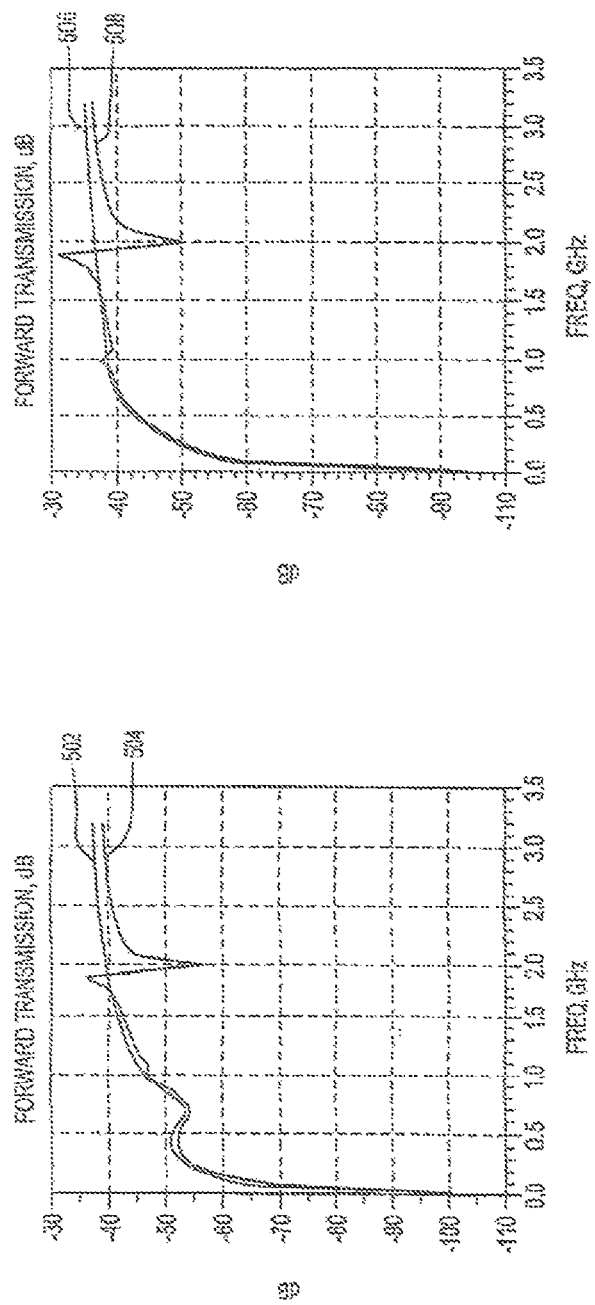

SEMICONDUCTOR PACKAGES HAVING WIRE BOND WALL TO REDUCE COUPLING

CROSS-REFERENCE TO RELATED APPLICATION

This application is a Continuation of co-pending, U.S. patent application Ser. No. 14/995,831, filed on Jan. 14, 2016, which is a Divisional of U.S. patent application Ser. No. 14/261,387, filed on Apr. 24, 2014 and now issued as U.S. Pat. No. 9,240,390, which is a Continuation-in-Part of U.S. patent application Ser. No. 13/929,688, filed on Jun. 27, 2013, and now issued as U.S. Pat. No. 9,401,342.

FIELD OF USE

The present disclosure relates generally to device packages, and more specifically, to device packages incorporating a wire bond wall structure to reduce coupling between adjacent devices.

BACKGROUND

Wireless communication systems often employ power amplifiers for increasing the power of a signal. In a wireless communication system, a power amplifier is usually the last amplifier in a transmission chain (the output stage). High gain, high linearity, stability, and a high level of power-added efficiency (i.e., the ratio of the difference between the output power and the input power to DC power) are characteristics of an ideal amplifier.

In general, a power amplifier operates at maximum power efficiency when the power amplifier transmits peak output power. However, power efficiency tends to worsen as output power decreases. Recently, the Doherty power amplifier architecture has been the focus of attention not only for base stations but also for mobile terminals because of the architecture's high power-added efficiency.

A Doherty power amplifier typically includes two or more amplifiers such as a carrier amplifier and a peaking amplifier. These amplifiers are connected in parallel with their outputs joined by an offset transmission line, which performs impedance transformation. The peaking amplifier delivers current as the carrier amplifier saturates, thereby reducing the impedance seen at the output of the carrier amplifier. Thus, the carrier amplifier delivers more current to the load while the carrier amplifier is saturated because of a "load-pulling" effect. Since the carrier amplifier remains close to saturation, a Doherty power amplifier is able to transmit peak output power so that the total efficiency of the system remains relatively high.

The high efficiency of the Doherty architecture makes the architecture desirable for current and next-generation wireless systems. However, the architecture presents challenges in terms of semiconductor package design. Current Doherty power amplifier semiconductor package design calls for the use of discrete devices and integrated circuits that may involve one device that includes the carrier amplifier and a separate device that includes the peaking amplifier. These discrete devices are maintained a distance apart in the package in order to limit problems with crosstalk that can occur between the carrier and peaking amplifiers.

One source of crosstalk in the semiconductor package architecture is between arrays of signal wires, referred to as wire bond arrays, that may be connected between the various electrical devices making up each of the carrier and peaking amplifiers. That is, the performance of a Doherty power amplifier can be adversely affected by coupling (i.e., the transfer of energy from one circuit component to another through a shared magnetic or electric field) between adjacent wire bond arrays of the corresponding components of the Doherty power amplifier. Coupling can be of two types, electric (commonly referred to as capacitive coupling) and magnetic (used synonymously with inductive coupling). Inductive or magnetic coupling occurs when a varying magnetic field exists between current carrying parallel conductors that are in close proximity to one another, thus inducing a voltage across the receiving conductor.

Unfortunately, maintaining spatial distance between amplifiers in the package limits the potential for miniaturization of the semiconductor package. Limiting miniaturization is undesirable where low cost, a low weight, and a small volume are important package attributes for various applications.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, where:

FIGS. 5A and 5B are graphs showing test results for an example device including a wire bond wall separating a carrier amplifier and peaking amplifier.

DETAILED DESCRIPTION

Figure 1:
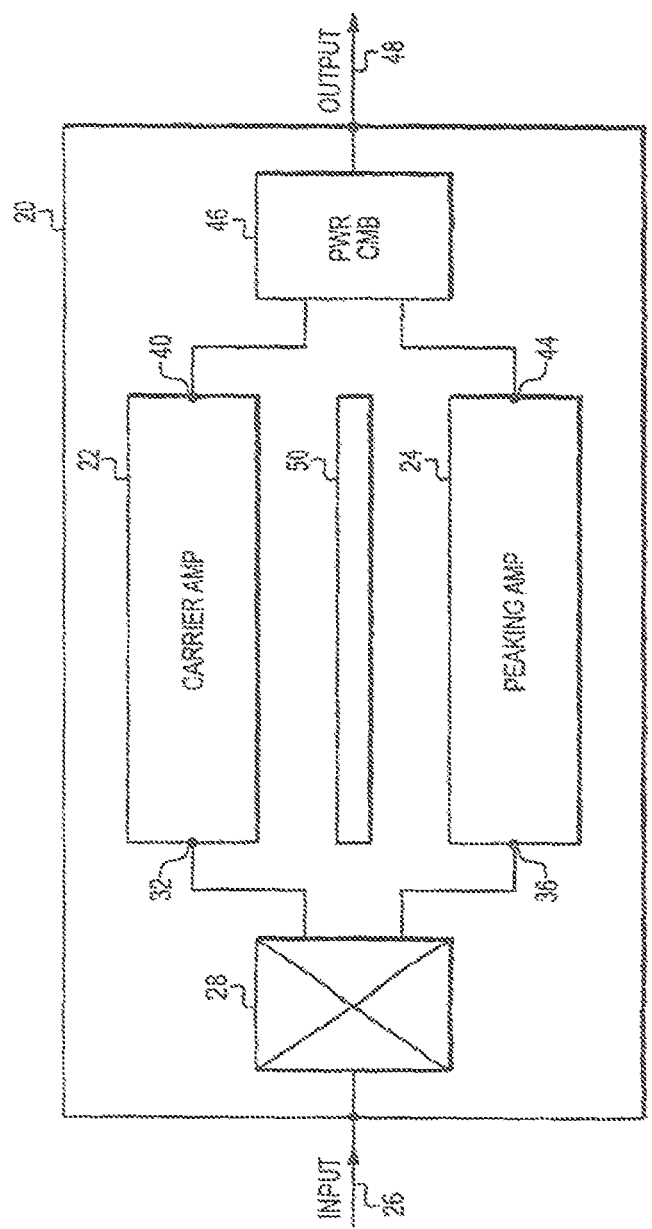
FIG. 1 is a block diagram of a Doherty power amplifier semiconductor package.

The following detailed description is exemplary in nature and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

The present disclosure relates generally to device packages, and more specifically, to device packages incorporating a wire bond wall to reduce coupling between adjacent devices formed within the package.

In one implementation, the package includes a Doherty amplifier lineup. In the present design, interference and/or cross-talk between the two amplifiers of the Doherty amplifier (i.e., the carrier amplifier and the peaking amplifier) is reduced so that the carrier and peaking amplifiers of the Doherty power amplifier may be implemented in a single package, referred to herein as a dual-path semiconductor package, with improved efficiency. In various other implementations, it will be appreciated that the present system may be used in various packages that include multiple components or circuits that are to be isolated from one another.

The present approach may be used to improve the usability of a Doherty power amplifier semiconductor package in base station power amplifiers, cell phones, blue tooth devices, and other devices dependent upon semiconductor packages, where low cost, low weight, and small volume are desired. An embodiment described herein reduces inductive coupling between wire bond arrays in a Doherty power amplifier. However, it will become apparent that the techniques described below for reducing inductive coupling may be implemented in a variety of semiconductor device designs.

FIG. 1 shows a block diagram of a Doherty power amplifier semiconductor package 20. Doherty power amplifier semiconductor package 20 includes a carrier amplifier circuit 22 and a peaking amplifier circuit 24 connected in parallel. An input signal 26 is split into two signals by an input splitter 28. One of the resulting input signals is communicated to an input 32 of carrier amplifier circuit 22, and another input signal is communicated to an input 36 of peaking amplifier circuit 24. An output signal is communicated from an output 40 of carrier amplifier circuit 22. Likewise, an output signal is communicated from an output 44 of peaking amplifier circuit 24. The two output signals are combined through a power combiner (PWR CMB) 46 to produce a combined output signal 48. Those skilled in the art will recognize that a Doherty power amplifier semiconductor package typically includes additional electronic devices and circuitry not shown herein for simplicity of illustration.

In one embodiment, carrier amplifier circuit 22 is configured to be on for an entire range of output powers of Doherty power amplifier semiconductor package 20. Peaking amplifier circuit 24 is configured to turn on only when carrier amplifier circuit 22 saturates. Power combiner 46, operating to combine the output signal from carrier amplifier circuit 22 with the output signal from peaking amplifier circuit 24 may be a quarter-wave impedance inverter. The quarter-wave impedance inverter can add a ninety degree lag to the output signal from carrier amplifier circuit 22. The phase of peaking amplifier circuit 24 is typically designed to lag carrier amplifier circuit 22 by ninety degrees so that the two output signals add in-phase when the output signals are combined at the output of power combiner 46 to form combined output signal 48.

In the example shown in FIG. 1, each of carrier amplifier circuit 22 and peaking amplifier circuit 24 may include a number of active and passive electrical elements. For example, carrier amplifier circuit 22 may include a capacitor coupled to input 32. The capacitor can be coupled to a transistor, which applies the appropriate amplification to the input signal received at input 32. An output of the transistor can be connected to a second capacitor. The capacitors can operate to condition the input signal received at input 32 and amplified by the transistor. Similarly, peaking amplifier 24 can include a capacitor coupled to input 36. The capacitor can be coupled to a transistor, which applies the appropriate amplification to the input signal received at input 36. An output of the transistor can be connected to a second capacitor. The capacitors can operate to condition the input signal received at input 36 and amplified by the transistor. Those skilled in the art will recognize that carrier amplifier circuit 22 and peaking amplifier circuit 24 may include additional electronic devices not shown herein for simplicity of illustration.

In Doherty amplifier package 20, the separate electrical devices making up each of carrier amplifier 22 and peaking amplifier 24 may be connected to one another using multiple parallel wires, known as wire bonds. In a practical application, one or more of the signal paths (e.g., between inputs, outputs, capacitors and transistors thereof) of carrier amplifier circuit 22 may be established using wire bonds. Likewise, one or more of the signal paths (e.g., between inputs, outputs, capacitors and transistors thereof) of peaking amplifier circuit 24 may be established using wire bonds.

In a Doherty power amplifier package, these various wire bond arrays may be placed in very close proximity to one another due to their being packaged into a single housing. The small distances between the signal paths of the various wire bonds interconnecting the components of each amplifier can lead to relatively high levels of inductive coupling between adjacent wire bond arrays. This inductive coupling can limit the power capability of an in-package Doherty amplifier.

Accordingly, in the present Doherty amplifier package, wire bond wall 50 is formed between the two amplifiers 22 and 24 to provide electrical isolation between the wire bonds arrays of each amplifier (e.g., carrier amplifier 22 and peaking amplifier 24). Wire bond wall 50, as described further below, is constructed from a number of wire bond connections formed within the package between the circuitry making up the carrier and peaking amplifiers. Wire bond wall 50, depending upon the implementation of package 20, may be built on various substrates or directly upon a leadframe of package 20. Along with the other components of package 20, wire bond wall 50 may be over molded with encapsulant or may be part of an air cavity package (e.g., air cavity package 70, FIG. 3C). In various implementations, wire bond wall 50 may be connected directly to ground or to a ground terminal which may, in turn be connected to a ground voltage, or connected to various integrated passive devices (IPDs) or other active devices and circuitry. In general, wire bond wall 50 operates as a shield or fence to interrupt and prevent the inductive coupling between the carrier amplifier circuit and the peaking amplifier circuit of the Doherty amplifier.

Figure 2A:
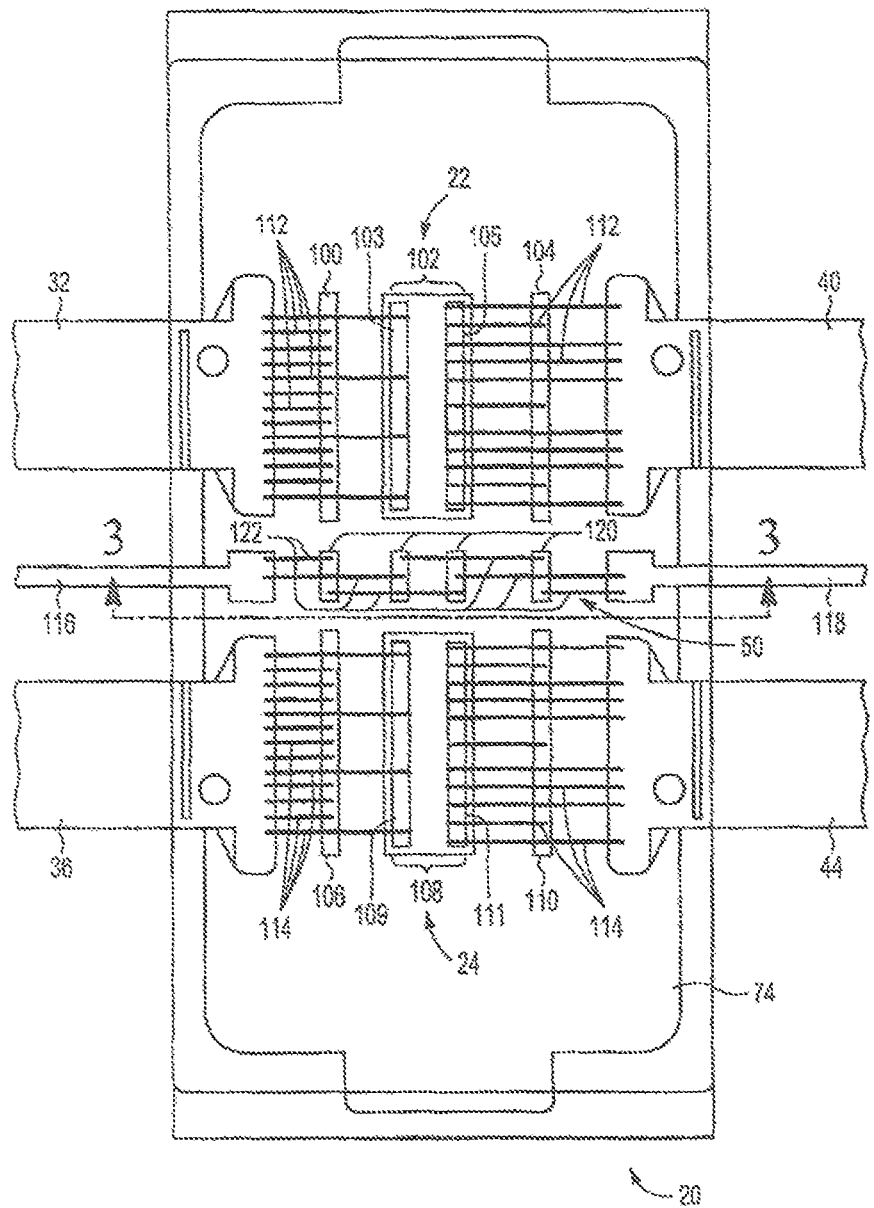
FIG. 2A is a top schematic view of the carrier and peaking amplifier circuits of a Doherty power amplifier semiconductor package.
Figure 2B:
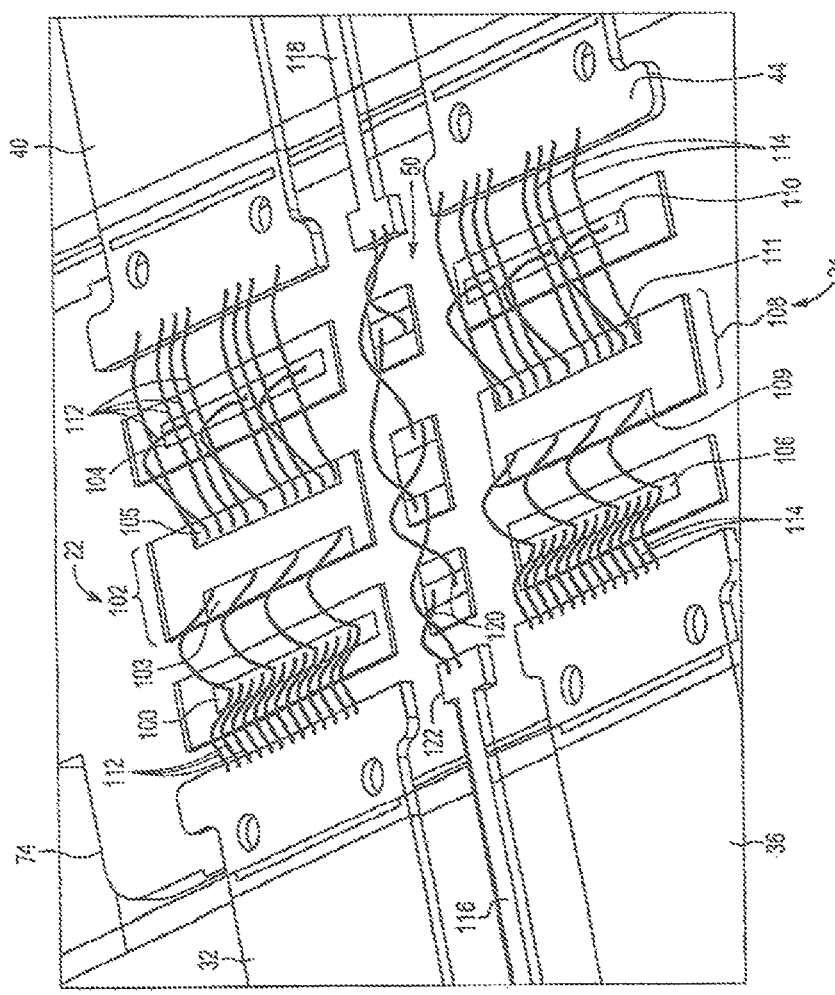
FIG. 2B is a perspective view of the Doherty power amplifier semiconductor package of FIG. 2A.

FIG. 2A is a top schematic view of carrier amplifier 22 circuit and peaking amplifier 24 circuit of Doherty power amplifier semiconductor package 20. FIG. 2B is a perspective view of Doherty power amplifier semiconductor package 20 of FIG. 2A. Although the present example is explained in terms of components of a Doherty amplifier, it should be understood that the present system and method may be employed to provide electrical isolation for any circuits formed over a substrate, where the components of a Doherty amplifier are only one example. In accordance with the present disclosure, a wire bond wall may be utilized to provide for electrical isolation between any components, suitably configured, within a particular package. For example, with reference to FIGS. 2A and 2B, carrier amplifier 22 may be replaced by any electrical circuit including a number of interconnected electrical devices and peaking amplifier 24 may be similarly replaced.

In package 20, carrier amplifier 22 includes input terminal 32 and output terminal 40, which, in a Doherty configuration, may constitute a gate terminal and a drain terminal of carrier amplifier 22, respectively. Similarly, peaking amplifier 24 includes input terminal 36 and output terminal 44, which, in a Doherty configuration, may constitute a gate terminal and a drain terminal of peaking amplifier 24, respectively.

Carrier amplifier 22 includes a number of electronic devices, such as capacitors 100 and 104 and transistor 102 (having gate pad 103 and drain pad 105) manufactured and/or subsequently mounted to the surface of a common (i.e., single) carrier, such as a package ground plane 74. Capacitors 100 and 104 may be, for example, Metal-Oxide-Semiconductor (MOS) capacitors mounted on ground plane 74. Similarly, peaking amplifier 24 includes a number of electrical devices, such as capacitors 106 and 110 and transistor 108 (having gate pad 109 and drain pad 111) manufactured and/or subsequently mounted to the surface of a common (i.e., single) carrier, such as a package ground plane 74. Capacitors 106 and 110 may be, for example, Metal-Oxide-Semiconductor (MOS) capacitors mounted on ground plane 74.

As shown in FIGS. 2A and 2B, the components of carrier amplifier 22 (including capacitors 100 and 104, transistor 102, and terminals 32 and 40) are connected by a number of wire bonds 112 forming an array of wire bonds. The components of peaking amplifier 24 (including capacitors 106 and 110, transistor 108, terminals 36 and 44) are similarly connected by a number of wire bonds 114, themselves forming an array of wire bonds. In various implementations, any number of wire bonds may be used to interconnect the various components of carrier amplifier 22 and peaking amplifier 24, or any other components that may be formed over a surface of ground plane 74.

In the depicted package 20, the symmetrical layout of carrier and peaking amplifier circuits 22 and 24 can result in the corresponding components of carrier amplifier circuit 22 being adjacent to corresponding components of peaking amplifier circuit 24. Accordingly, the arrangement of various components of each amplifier (including, specifically, the wire bonds 112 and 114 of each amplifier carrying high-frequency signals) are adjacent to and geometrically parallel with one another. These attributes of the wire bond arrays of carrier amplifier 22 and peaking amplifier 24 can result in coupling between the devices, which can reduce the performance of the overall device.

To minimize coupling between carrier amplifier 22 and peaking amplifier 24, package 20 includes wire bond wall 50 separating carrier amplifier 22 and peaking amplifier 24. Wire bond wall includes terminals 116 and 118 which, in one implementation, can each be connected to ground. A number of connection pads 120 are formed over a surface of ground plane 74. In one implementation, each of connection pads 120 are connected to a ground voltage, for example, by connecting the connection pads 120 to a ground plane (e.g., ground plane 74) of package 20 or to one or more ground terminals that can then be connected to a ground voltage. A number of wire bonds 122 are then formed between the connection pads 120 and terminals 116 and 118. The position and geometrical configuration of connection pads 120 enables the various wire bonds 122 making up wire bond wall 50 to be separated by an appropriate pitch distance, depending upon the implementation of package 20. In one implementation, the pitch distance is between 5 and 6 millimeters (mm).

As a whole, wire bonds 122 form a wall or mesh of grounded wire bonds that operate to electrically isolate carrier amplifier 22 from peaking amplifier 24. Wire bonds 122 may be formed of a suitable conductive metal the same as or different from that of wire bonds 112 and/or 114. Example materials include gold, copper, aluminum, or silver. In one implementation, wire bond wall 50 and wire bonds 122 thereof operate as a passive device configured to absorb and, thereby, block or inhibit the electric fields generated by carrier amplifier 22 and peaking amplifier 24 from impinging upon one another. Depending upon the implementation, the configurations of wire bonds 122 may be adjusted or tuned to serve particular needs, such as to block particular frequency ranges or particular bandwidths. These adjustments may involve changing the lengths of the individual wire bonds 122 that make up wire bond wall 50 and the degree to which the various wire bonds overlap one another. Once formed, an encapsulant (not shown) may be deposited over package 20 to provide physical protection to the wire bonds therefore, as well as the other components of package 20.

In various implementations, wire bond wall 50 includes a number of wire bonds that are formed along a route between two circuits or components that are to be isolated from one another. When wire bond wall 50 runs along a straight line, the wire bonds 122 making up wire bond wall 50 are each formed generally parallel to one another. As shown in FIG. 2B, wire bond wall 50 may run along a route or pathway that is perpendicular to a line drawn between carrier amplifier 22 and peaking amplifier 24. Generally, wire bond wall 50 runs along a region of ground plane 74 that is located between carrier amplifier 22 and peaking amplifier 24. Within wire bond wall 50, the individual wire bonds 122 may be formed in a single row, or, as depicted in FIG. 2A, multiple rows. FIG. 2A shows wire bond wall 50 including three rows of wire bonds 122. Also, as depicted in FIG. 2B, the wire bonds 122 making up wire bond wall 50 can connect to every connection pad 120 of wire bond wall 50 or may, in some cases, skip over connection pads 120.

When a wire bond wall is made up of multiple rows of wire bonds, one approach for constructing the wire bond wall is to provide that, for each connection pad, at least one wire bond from one row of the wire bond wall is connected to the connection pad and at least one wire bond from another row is not connected to the connection pad. This approach can provide that the wire bonds making up the wire bond wall form a mesh that, when viewed from the side, has smaller openings than if the wire bonds of each row were to be identically connected.

In addition to running along a straight line, the wire bond wall may be formed along non-straight routes. In some cases, non-straight routes may be called for by the layout and/or geometry of the circuitry being isolated. In other implementations, the wire bond wall may be formed substantially around a particular circuit. This may enable a circuit in the package to be isolated not only from other circuits in the package, but from radiation sources external to the package.

Figure 3A:
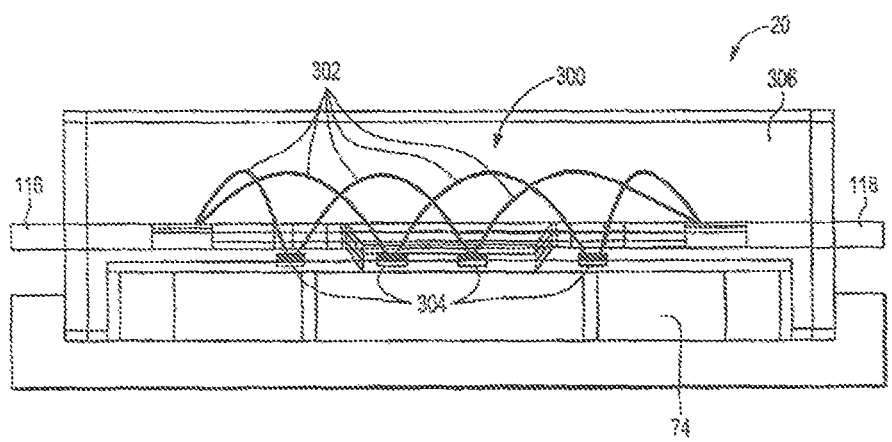
FIGS. 3A and 3B are cross-sectional views of a package depicting alternative wire bond wall configurations.
Figure 3B:
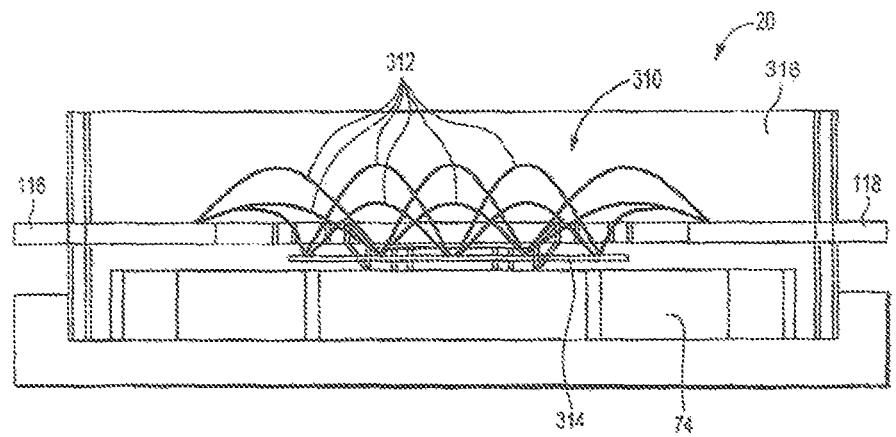

To illustrate some different configurations of wire bond wall 50, FIGS. 3A and 3B are cross-section views of a package depicting alternative wire bond wall configurations. The cross-section could be taken, for example, along line 3-3 shown in FIG. 2A, but illustrate different wire bond wall configurations than that shown in FIG. 2A. In FIG. 3A, wire bond wall 300 is formed by a number of wire bonds 302 interconnecting connection pads 304 and terminals 116 and 118. A protective encapsulant 306 is formed over wire bonds 302. In FIG. 3B wire bond wall 310 is formed by a number of wire bonds 312 over a ground plane or connection pad structure 314 and interconnecting terminals 116 and 118. A protective encapsulant 316 is formed over wire bonds 312. The configuration illustrated in FIG. 3B includes a greater number of wire bonds compared to that of FIG. 3A and, as such, the wire bond wall of FIG. 3B, when viewed from the side, has greater density, reducing the average size of the openings in wire bond wall 50.

Figure 3C:
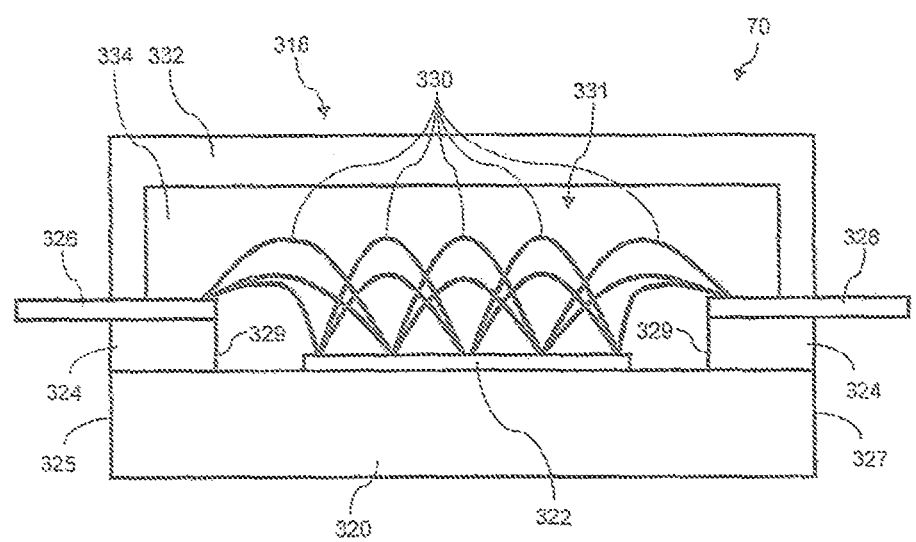
FIG. 3C is a cross-sectional view of a device with a wire bond wall housed in an air cavity package.

As mentioned above, rather than being over molded with encapsulant (e.g., as in packages 20 depicted in FIGS. 3A and 3B), a wire bond wall (and/or other circuitry coupled to terminals 116, 118) may be disposed in an air cavity of an air cavity package. For example, FIG. 3C illustrates a device housed in an air cavity package 70. Among other components, the device includes a wire bond wall 318 electrically connected between two terminals 326 and 328 of the air cavity package 70.

More specifically, the device includes a substrate 320 and one or more isolation structures 324 on or over the top surface of the substrate. The substrate 320 may be a flange formed from a solid conductive material (e.g., a copper flange), for example. Alternatively, the substrate 320 may be a multi-layered structure with a conductive top surface. Either way, according to an embodiment, the substrate 320 may be connected to ground.

The isolation structure(s) 324 may be formed from one or more materials that are substantially electrically insulating. For example, the isolation structure(s) 324 may be formed from ceramic, from organic printed circuit board materials, or from other substantially insulating materials. The isolation structure(s) 324 may include multiple distinct portions (e.g., a portion adjacent a first side 325 of the device, and a separate portion adjacent a second side 327 of the device). Alternatively, a single isolation structure 324 may have a frame-shaped configuration with portions adjacent the sides 325, 327 of the device. Either way, sidewalls 329 of the isolation structure(s) 324 define an active circuit area 331 (i.e., the area over the top surface of the substrate 320 between facing sidewalls 329).

The device also includes a first circuit (not illustrated, but analogous to carrier amplifier circuit 22) over the top surface of the substrate 320 and within the active circuit area 331, and a second circuit (also not illustrated, but analogous to peaking amplifier circuit 24) over the top surface of the substrate 320, within the active circuit area 331 and adjacent to the first circuit. First and second leads (not illustrated, but analogous to leads 32, 40) are coupled to portions of the isolation structure 324 that are proximate to the first and second sides 325, 327 of the package, and also are electrically coupled to the first circuit. In addition, third and fourth leads (not illustrated, but analogous to leads 36, 44) also are coupled to portions of the isolation structure 324 that are proximate to the first and second sides 325, 327 of the package 70, and also are electrically coupled to the second circuit.

The device also includes a first terminal 326 over the first side 325 of the package 70 between the first lead and the third lead, and a second terminal 328 over the second side 327 of the package 70 between the second lead and the fourth lead. For example, the first and second terminals 326, 328 may be coupled to the top surface of the isolation structure 324. The first and second terminals 326, 328 are analogous to first and second terminals 116, 118. In addition, the first and second terminals 326, 328 each may be coupled to ground (or to other external nodes).

The device also includes an electronic component coupled to the package 70 and electrically coupled to the first terminal 326, the second terminal 328, or both the first and second terminals 326, 328. As shown in FIG. 3C, the electronic component includes the wire bond wall 318. As with the previously-described embodiments, wire bond wall 318 may be positioned between the first and second adjacent circuits (e.g., between a carrier amplifier and a peaking amplifier), and thus may reduce coupling between the first and second circuits. Wire bond wall 318 includes terminals 326 and 328 and wire bonds 330.

A number of connection pads (not shown, but analogous to connection pads 304) or a connection pad structure 322 (analogous to connection pad structure 314) may be formed over or on a top surface of substrate 320. The wire bonds 330 are formed between the connection pads or connection structure 322 and terminals 326, 328. Alternatively, the wire bonds 330 may be coupled directly to the top surface of substrate 320.

As with the previously described embodiments, wire bonds 330 form a wall or mesh of grounded wire bonds that operate to electrically isolate the first and second circuits (e.g., carrier amplifier 22 and peaking amplifier 24). To complete the package 70, a cap 332 may be placed over the wire bond wall 318 and the circuitry within the active circuit area 331, thus establishing an air cavity 334.

Although a particular configuration for wire bond wall 318 is depicted in FIG. 3C, it is to be understood that the wire bond wall may have other configurations, as well (e.g., configurations illustrated in FIGS. 2A, 2B, 3A, 3B, or other configurations). Generally, the configuration of wire bond wall 50, 300, 310, 318 is selected to absorb and thereby block electromagnetic transmissions in a particular range of frequencies. In many cases, the frequencies being blocked are the operating frequencies of the devices formed within the package. For a given implementation, a number of candidate wire bond walls configurations may be simulated where the various candidates include varying numbers of wire bonds, varying lengths of wire bonds, varying numbers of rows of wire bonds, and a different number of overlapping wire bonds to determine their responses to particular input signals. One example tool for performing such simulations includes HFSS, which is a tool useful for antenna design. Then, in accordance with the desired circuit performance, a particular wire bond wall design can be selected.

In FIGS. 2A, 2B, 3A, 3B, and 3C, wire bond wall 50, 300, 310, 318 may be grounded or floating and generally operates as a passive component of package 20, 70. In essence, when grounded, wire bond wall 50, 300, 310, 318 operates as a tuned antenna configured to absorb the electromagnetic emissions of either of carrier amplifier 22 and peaking amplifier 24 (or other circuitry) to prevent those emissions from impinging upon the other circuit.

Figure 4A:
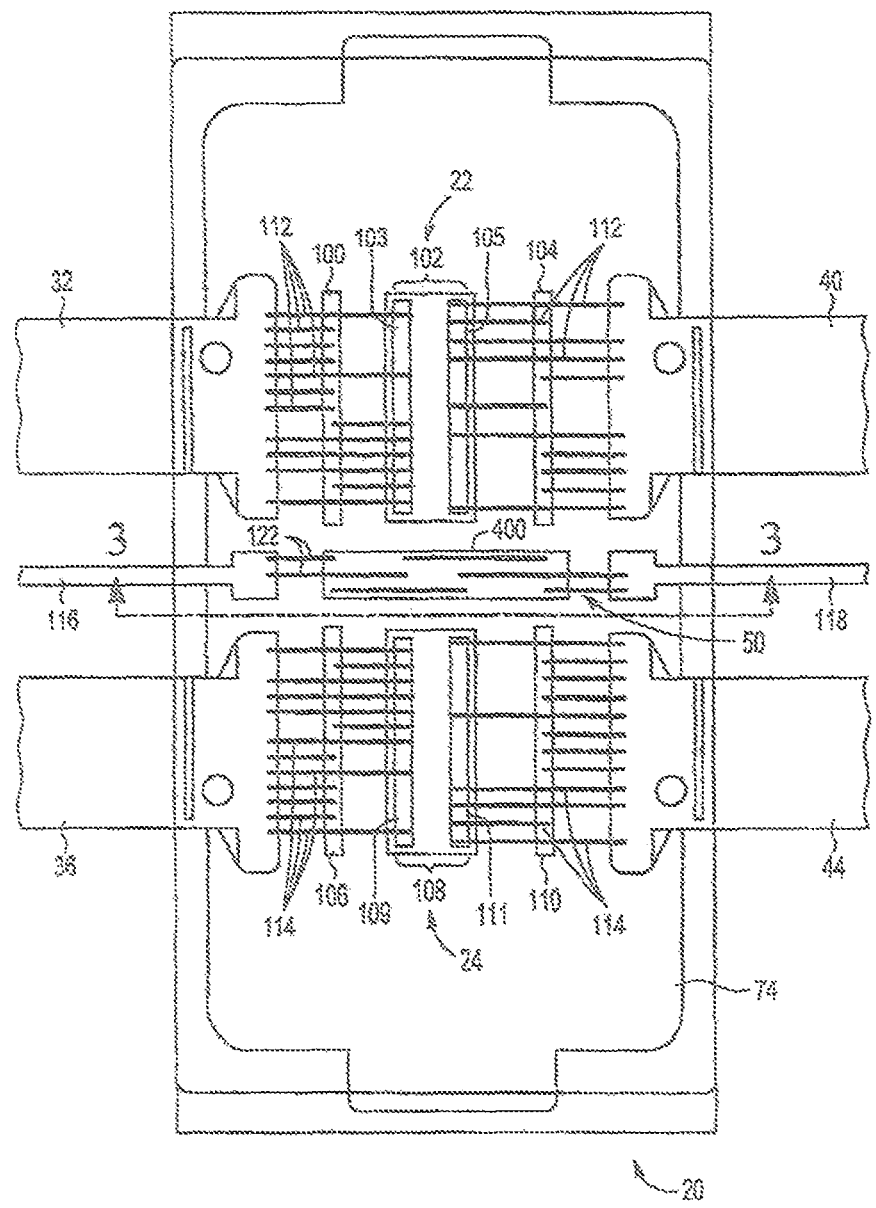
FIGS. 4A and 4B show the package of FIG. 2A where the wire bond wall is connected to a number of additional devices.
Figure 4B:
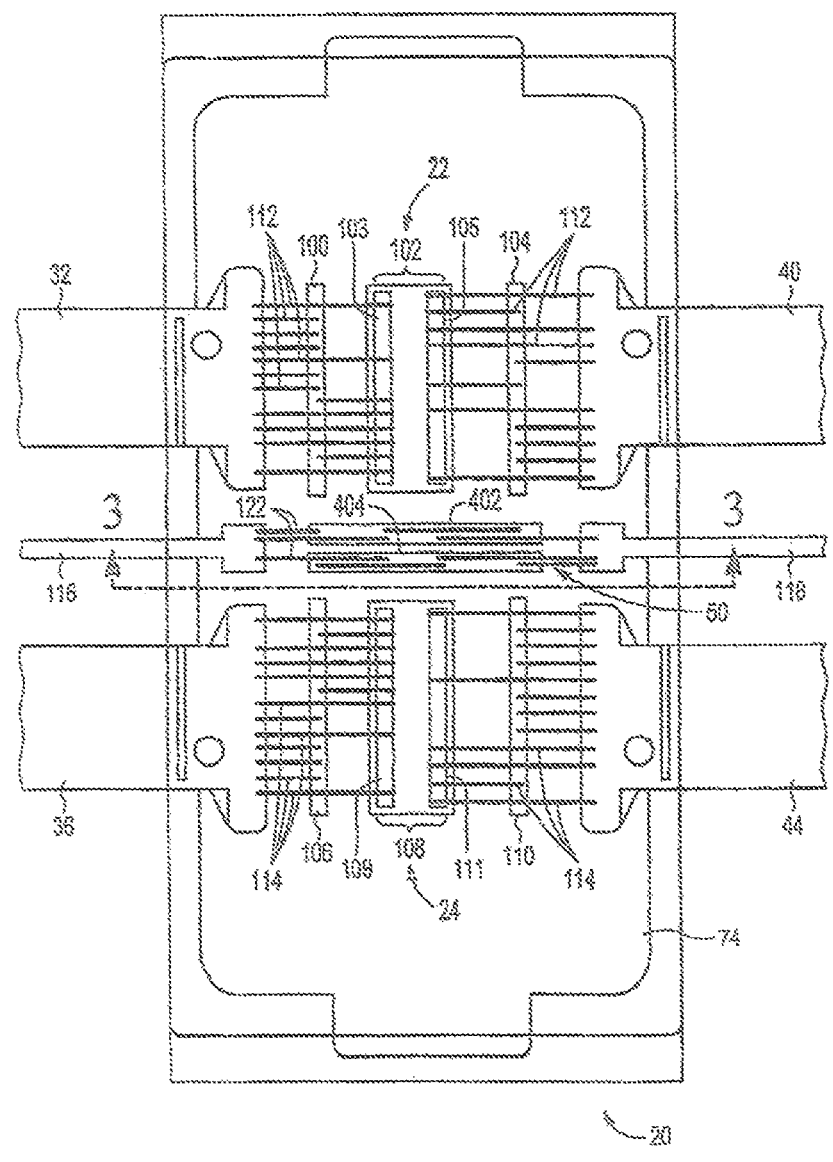

In some implementations, wire bond wall 50, 300, 310, 318 may be connected to one or more passive or active devices to further control and/or optimize the response of wire bond wall 50, 300, 310, 318. The additional devices may be formed within package 20, 70, or may be external to package 20, 70. To illustrate, FIGS. 4A and 4B show package 20 where wire bond wall 50 is connected to a number of additional devices. As shown in FIG. 4A, wire bond wall 50 is connected to IPD 400. IPD 400 may include combinations of resistors, capacitors, and inductors that are formed within package 20. Generally, a capacitance and/or inductance of IPD 400 will be selected so that, when connected to wire bond wall 50, the impedance of wire bond wall 50 in combination with IPD 400 is tuned to block a desired range of signal frequencies. This impedance matching serves to minimize the coupling between carrier amplifier 22 and peaking amplifier 24, thereby improving the efficiency of the package 20. By tuning the performance of the wire bond wall 50 by incorporating IPD 400, a reduction in coupling can be achieved over a particular frequency range. FIG. 4B illustrates an alternative embodiment including two IPDs 402 and 404, where IPDs 402 and 404 run parallel to one another. IPDs 402 and 404 are coupled to wire bond wall 50. In various implementations, any number of IPDs may be provided in combination with wire bond wall 50 to provide electrical isolation of the components of package 20. Similar embodiments may be implemented with wire bond walls 300, 310, 318 and package 70.

In other implementations, wire bond wall 50, 300, 310, 318 may also be connected to one or more active devices that may be configured to modify an impedance of wire bond wall 50, 300, 310, 318 depending upon the operational attributes of carrier amplifier 22 and peaking amplifier 24 (or other circuits of package 20, 70) or other system components. In that case, the active devices may be tunable depending upon a particular operating frequency of the circuits of package 20, 70, for example, to meet particular frequency and/or bandwidth requirements.

In addition to providing the electrical isolation benefits described above, the present wire bond wall implementation is additionally beneficial in that it may be constructed using similar fabrication techniques that are used to manufacture the remainder of package 20, 70. The wire bonds of the wire bond wall can, in some implementations, be fabricated using the same wire bonding techniques used to interconnect the components of carrier amplifier 22 and peaking amplifier 24, for example. This stands in contrast to some other isolation techniques that may require a radical redesign of the structure of package 20, 70. For example, if a solid metal wall were to be disposed between carrier amplifier 22 and peaking amplifier 24 in an attempt to provide electrical isolation, entirely new fabrication techniques (and, potentially, machinery) would have be developed and utilized to install such a structure within an existing package design. In fact, in many cases, the packages would have to be entirely redesigned to incorporate such a component.

In simulation, embodiments of the present wire bond wall structure have demonstrated improved performance over a conventional package. In one simulation of a Doherty structure including a wire bond wall configured in accordance with the depiction in FIG. 3B operating at approximately 2 GHz, a grounded wire bond wall reduced detected coupling by approximately 3 dB and a wire bond wall with integrated IPD reduced detected coupling by approximately 17 dB. For comparison, a reduction of only 5 dB was observed in simulations when a solid metal wall was positioned between the components of the Doherty amplifier.

FIGS. 5A and 5B are graphs showing simulation results for an example device including a wire bond wall configured in accordance with the depiction of FIG. 3B separating a carrier amplifier and peaking amplifier within a single package, where the wire bond wall is connected to a suitably configured IPD. The graphs depict an amount of coupling between nodes within the package (vertical axis, dB) versus frequency (horizontal axis, GHz). FIG. 5A depicts the test results as measured between elements 105 and 44 of FIG. 2A. FIG. 5B depicts the test results as measured between elements 40 and 44 of FIG. 2A.

In FIG. 5A, line 502 shows the results for a conventional device (including no wire bond wall) and line 504 shows the results for the device of FIG. 2B (including the wire bond wall 50). As seen in FIG. 5A, there is a sharp reduction in coupling around the operational frequency (approximately 2 GHz) of the Doherty amplifier. In FIG. 5B, line 506 shows the results for a conventional device (including no wire bond wall) and line 508 shows the results for the device of FIG. 2B (including the wire bond wall 50). As seen in FIG. 5A, there is a sharp reduction in coupling around the operational frequency (approximately 2 GHz) of the Doherty amplifier. This reduction in coupling, provided by the wire bond wall, enables more efficient operation of the amplifier.

The embodiments described above include wirebond structures (e.g., wirebond walls 50, 300, 310, 318) coupled between input-side and output-side terminals (e.g., terminals 116, 118 or 326, 328) of a device, where the input-side and output-side terminals are distinct from terminals associated with the primary signal carrying paths (e.g., terminals 32 and 40 associated with carrier amplifier circuit 22, and terminals 36 and 44 associated with peaking amplifier circuit 24). In alternate embodiments, other types of electrical circuits and/or structures may be coupled between such input-side and output-side terminals (e.g., terminals 116, 118 or 326, 328) of a device. For example, rather than coupling wirebond structures between input-side and output-side terminals (e.g., terminals 116, 118 or 326, 328), circuits that include various combinations of passive components (e.g., capacitors, inductors, and resistors) may be coupled between those input-side and output-side terminals to tune resonance of a circuit within the device, improve video bandwidth of the device, provide DC feed to portions of the device, and/or to otherwise alter the performance characteristics of the device. Also, additional active structures (e.g., transistors, diodes, and so on) can be placed inside the package and connected to input-side and output-side terminals (e.g., terminals 116, 118) to perform the same and/or different functions from those mentioned above.

Further, although the illustrated embodiments depict a single wire bond wall (50, 300, 310, 318) used to reduce coupling between two adjacent circuits (e.g., carrier amplifier 22 and peaking amplifier 24), other embodiments may include two or more wire bond walls used to reduce coupling between two or more sets of adjacent circuits. For example, an embodiment of a device may be implemented in a Doherty amplifier that includes a main amplifier circuit and two peaking amplifier circuits. A first wire bond wall may be used to reduce coupling between the main amplifier circuit and the first peaking amplifier circuit, and a second wire bond wall may be used to reduce coupling between the second peaking amplifier circuit and either the main amplifier circuit or the first peaking amplifier circuit (depending on which of those circuits the second peaking amplifier circuit is adjacent to).

An embodiment of a device housed in an air cavity package includes a substrate having a top surface, and one or more isolation structures over the top surface of the substrate. An area over the top surface of the substrate within sidewalls of the one or more isolation structures defines an active circuit area. The device also includes first and second circuits over the top surface of the substrate within the active circuit area. The second circuit is adjacent to the first circuit. The device also includes a first lead coupled to a portion of the one or more isolation structures that is proximate to a first side of the package, a second lead coupled to a portion of the one or more isolation structures that is proximate to a second side of the package, a third lead coupled to the portion of the one or more isolation structures that is proximate to the first side of the package, a fourth lead coupled to the portion of the one or more isolation structures that is proximate to the second side of the package, a first terminal over the first side of the package between the first lead and the third lead, a second terminal over the second side of the package between the second lead and the fourth lead, and an electronic component coupled to the package and electrically coupled to the first terminal, the second terminal, or both the first and second terminals. The first lead is electrically coupled to the first circuit, the second lead is electrically coupled to the first circuit, the third lead is electrically coupled to the second circuit, and the fourth lead is electrically coupled to the second circuit.

An embodiment of a Doherty amplifier package includes a substrate having a top surface, and one or more isolation structures over the top surface of the substrate. An area over the top surface of the substrate within sidewalls of the one or more isolation structures defines an active circuit area. The package also includes a carrier amplifier over the top surface of the substrate within the active circuit area, and a peaking amplifier over the top surface of the substrate within the active circuit area and adjacent to the carrier amplifier. The package also includes a first lead coupled to a portion of the one or more isolation structures that is proximate to a first side of the package, a second lead coupled to a portion of the one or more isolation structures that is proximate to a second side of the package, a third lead coupled to the portion of the one or more isolation structures that is proximate to the first side of the package, a fourth lead coupled to the portion of the one or more isolation structures that is proximate to the second side of the package, a first terminal over the first side of the package between the first lead and the third lead, a second terminal over the second side of the package between the second lead and the fourth lead, and an electronic component coupled to the package and electrically coupled to the first terminal, the second terminal, or both the first and second terminals. The first lead is electrically coupled to an input to the carrier amplifier, the second lead is electrically coupled to an output of the carrier amplifier, the third lead is electrically coupled to an input to the peaking amplifier, and the fourth lead is electrically coupled to an output of the peaking amplifier.

An embodiment of a method of making a device housed within a package includes attaching one or more isolation structures to a top surface of a substrate, where an area over the top surface of the substrate within sidewalls of the one or more isolation structures defines an active circuit area. The method also includes attaching a first lead to a portion of the one or more isolation structures that is proximate to a first side of the package, attaching a second lead to a portion of the one or more isolation structures that is proximate to a second side of the package, attaching a third lead to the portion of the one or more isolation structures that is proximate to the first side of the package, attaching a fourth lead to the portion of the one or more isolation structures that is proximate to the second side of the package, attaching a first terminal between the first lead and the third lead, and attaching a second terminal between the second lead and the fourth lead. The method also includes attaching a first circuit over the top surface of the substrate within the active circuit area, and electrically coupling the first circuit between the first and second leads, attaching a second circuit over the top surface of the substrate within the active circuit area and adjacent to the first circuit, and electrically coupling the second circuit between the third and fourth leads, and attaching an electronic component to the package, and electrically coupling the electronic component to the first terminal, the second terminal, or between both the first and second terminals.

Although the present disclosure describes specific examples, embodiments, and the like, various modifications and changes can be made without departing from the scope of the present disclosure as set forth in the claims below. For example, although the exemplary methods, devices, and systems described herein are in conjunction with a configuration for the aforementioned device, the skilled artisan will readily recognize that the exemplary methods, devices, and systems may be used in other methods, devices, and systems and may be configured to correspond to such other exemplary methods, devices, and systems as needed. Further, while at least one embodiment has been presented in the foregoing detailed description, many variations exist. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all of the claims.

What is claimed is:

1. A device comprising:
   a ground plane having a first surface;
   a first circuit coupled to the first surface of the ground plane;
   a second circuit coupled to the first surface of the ground plane adjacent to the first circuit;
   a first lead coupled to but electrically isolated from the ground plane, which is proximate to a first side of a package, wherein the first lead is electrically coupled to the first circuit;
   a second lead coupled to but electrically isolated from the ground plane, which is proximate to a second side of the package, wherein the second lead is electrically coupled to the first circuit;
   a third lead coupled to but electrically isolated from the ground plane, which is proximate to the first side of the package, wherein the third lead is electrically coupled to the second circuit;
   a fourth lead coupled to but electrically isolated from the ground plane, which is proximate to the second side of the package, wherein the fourth lead is electrically coupled to the second circuit; and a wire bond wall coupled to a region of the ground plane that is located between the first circuit and the second circuit, wherein the wire bond wall includes a plurality of wirebonds that are arranged in one or more rows between the first and second sides of the package, and the wire bond wall runs along a route that is perpendicular to a line drawn between the first and second circuits.

2. The device of claim 1, wherein the wire bond wall includes a single row of wirebonds.

3. The device of claim 1, wherein the wire bond wall includes multiple rows of wirebonds that are parallel to each other.

4. The device of claim 3, wherein the multiple rows of wire bonds are separated by a pitch distance between 5 and 6 millimeters.

5. The device of claim 1, wherein the route is located between the first and third leads, and between the second and fourth leads.

6. The device of claim 1, further comprising:
one or more connection pads connected to the region of the ground plane that is located between the first circuit and the second circuit, wherein the wire bonds are connected to the one or more connection pads.

7. The device of claim 1, further comprising:
a first terminal between the first lead and the third lead;
a second terminal between the second lead and the fourth lead; and
additional wirebonds coupling the first terminal and the second terminal to the wire bond wall.

8. The device of claim 1, wherein the wire bonds are formed from a conductive metal selected from gold, copper, aluminum, and silver.

9. The device of claim 1, wherein the wire bond wall is configured to reduce an electromagnetic coupling between the first circuit and the second circuit during an operation of at least one of the first circuit and the second circuit.

10. The device of claim 1, further comprising an encapsulant covering the first and second circuits and the wire bond wall.

11. The device of claim 1, wherein the device forms part of an air cavity package.

12. An amplifier package comprising:
a ground plane having a first surface;
a first amplifier coupled to the first surface of the ground plane;
a second amplifier coupled to the first surface of the ground plane adjacent to the first amplifier;
a first lead coupled to but electrically isolated from the ground plane, which is proximate to a first side of the package, wherein the first lead is electrically coupled to the first amplifier;
a second lead coupled to but electrically isolated from the ground plane, which is proximate to a second side of the package, wherein the second lead is electrically coupled to the first amplifier;
a third lead coupled to but electrically isolated from the ground plane, which is proximate to the first side of the package, wherein the third lead is electrically coupled to the second amplifier;
a fourth lead coupled to but electrically isolated from the ground plane, which is proximate to the second side of the package, wherein the fourth lead is electrically coupled to the second amplifier; and
a wire bond wall coupled to a region of the ground plane that is located between the first amplifier and the second amplifier, wherein the wire bond wall includes a first plurality of wirebonds that are arranged in one or more rows between the first and second sides of the package, and the wire bond wall runs along a route that is perpendicular to a line drawn between the first and second amplifiers.

13. The amplifier package of claim 12, wherein the first amplifier is a carrier amplifier of a Doherty amplifier, and the second amplifier is a peaking amplifier of the Doherty amplifier.

14. The amplifier package of claim 12, wherein:
the first amplifier includes a first transistor coupled to the ground plane, wherein the first transistor has a first gate pad and a first drain pad, wherein the first gate pad is electrically coupled to the first lead through a second plurality of wirebonds, and the first drain pad is electrically coupled to the second lead through a third plurality of wirebonds; and
the second amplifier includes a second transistor coupled to the ground plane, wherein the second transistor has a second gate pad and a second drain pad, wherein the second gate pad is electrically coupled to the third lead through a fourth plurality of wirebonds, and the second drain pad is electrically coupled to the fourth lead through a fifth plurality of wirebonds.

15. The amplifier package of claim 14, wherein the wire bond wall coupled to the ground plane between the first transistor and the second transistor.

16. The amplifier package of claim 14, further comprising:
a first capacitor coupled to the ground plane between the first lead and the first transistor, wherein the first capacitor is electrically coupled to the first lead with a sixth plurality of wirebonds; and
a second capacitor coupled to the ground plane between the third lead and the second transistor, wherein the second capacitor is electrically coupled to the third lead with a seventh plurality of wirebonds.

17. The amplifier package of claim 14, further comprising:
a first capacitor coupled to the ground plane between the first transistor and the second lead, wherein the first capacitor is electrically coupled to the first drain pad with a sixth plurality of wirebonds; and
a second capacitor coupled to the ground plane between the second transistor and the fourth lead, wherein the second capacitor is electrically coupled to the second drain pad with a seventh plurality of wirebonds.

18. The amplifier package of claim 12, wherein the wire bond wall includes a single row of wirebonds.

19. The amplifier package of claim 12, wherein the wire bond wall includes multiple rows of wirebonds that are parallel to each other.

20. The amplifier package of claim 12, further comprising:
one or more connection pads connected to the region of the ground plane that is located between the first amplifier and the second amplifier, wherein the wire bonds are connected to the one or more connection pads.

21. The amplifier package of claim 12, further comprising:
a first terminal between the first lead and the third lead;
a second terminal between the second lead and the fourth lead; and additional wirebonds coupling the first terminal and the second terminal to the wire bond wall.

* * * * *